United States Patent [19]

Kitaguchi

[11] Patent Number: 5,463,362
[45] Date of Patent: Oct. 31, 1995

[54] TUNER CIRCUIT HAVING A SWITCHING DIODE TO CHANGE RECEIVING BANDS

[75] Inventor: Masanori Kitaguchi, Habikino, Japan

[73] Assignee: Sharp Kabushiki Kaisha, Osaka, Japan

[21] Appl. No.: 277,048

[22] Filed: Jul. 19, 1994

[30] Foreign Application Priority Data

Aug. 19, 1993 [JP] Japan .................................. 5-204925

[51] Int. Cl.⁶ ........................................................ H03J 5/24
[52] U.S. Cl. .................... 334/47; 334/15; 334/27
[58] Field of Search .................. 334/11, 15, 47, 334/56–58; 455/180.2, 180.4, 188.1, 191.2, 191.3

[56] References Cited

U.S. PATENT DOCUMENTS 3,980,957  9/1976  Putzer .......................... 334/15 X
4,573,211  2/1986  Kupfer .......................... 334/56 X

FOREIGN PATENT DOCUMENTS 250422  10/1990  Japan .......................... 334/15
5191364  7/1993  Japan .

*Primary Examiner*—Paul Gensler

[57] ABSTRACT

A tuner circuit is basically composed of: a series of a low-band coil and a high-band coil disposed on the signal side; a series of a low-band coil and a high-band coil disposed on the earth side; and a switching diode disposed between a junction of the low-band coil and high-band coil on the signal side and another junction of the low-band coil and high-band coil on the earth side. Further, the junction of the low-band coil and high-band coil on the signal side is connected to a band switching terminal via a first bias resistor while an input side terminal of the low-band coil on the signal side is connected with a second bias resistor.

7 Claims, 5 Drawing Sheets

TUNER CIRCUIT HAVING A SWITCHING DIODE TO CHANGE RECEIVING BANDS

BACKGROUND OF THE INVENTION (1) Field of the Invention

The present invention relates to a tuner circuit for use in a high-frequency circuit in a television receiver, video tape recorder or the like, and more particularly to a tuner circuit including circuit which uses a switching diode to change over receiving bands.

(2) Description of the Prior Art

A tuner circuit used in a television receiver or the like selects a signal belonging to a desired channel from television signals of VHF or UHF bands received by an antenna so as to convert the selected signal into its intermediate frequency signal to be input to a next step or an intermediate-frequency amplifier for video signal.

Most of recent tuner circuits are of electronic tuning type tuners in which coils in a tuning circuit are changed over by switching diodes while adjustment of capacitance of a capacitor in the tuning circuit is performed with a capacitance variable diode.

FIG. 1 is a circuit diagram showing a prior art example of an input tuning circuit in such a tuner circuit. The input tuning circuit is connected to a preceding filter circuit (not shown) with a coupling capacitor C1 and is connected to a next high-frequency amplifying circuit (not shown) with another coupling capacitor C2.

An output of coupling capacitor C1 is bifurcated into the earth side and the hot side. The earth side is connected with a series circuit of an earth side low-band coil L1 and an earth side high-band coil L2 while the hot side is connected with a series circuit of a hot side low-band coil L3 and a hot side high-band coil L4.

An earth side terminal of earth side high-band coil L2 is connected to a power supply terminal BH for high band and a bypass capacitor C3 which is grounded at its other end. An output terminal of high-band coil L4 on the hot side is connected to the next step through coupling capacitor C2. The output terminal of high-band coil L4 is also connected to a series circuit of a tuning capacitor C4 and a capacitance variable diode D1, which in turn is grounded. The cathode terminal of capacitance variable diode D1 is connected to a tuning voltage terminal VT through a tuning voltage applying resistor R1.

A series circuit of a switching diode D2 arranged in forward direction and a bias resistor R2 is connected from a junction of coil L3 and coil L4 to the ground while another series circuit of bias resistor R3 and bypass capacitor C5 is connected in parallel with bias resistor R2. Further, the earth side terminal of resistor R3 is connected to a power source terminal BL.

A junction between coil L1 and coil L2 on the earth side is connected with a coupling capacitor C6 to the cathode of diode D2. Disposed between the earth side terminal of earth side coil L1 and the output side terminal of hot side coil L3 is a damping resistor R4 which will be discussed later.

In this way, in the case of the VHF tuner, since it is impossible to cover the entire frequency range by varying only the capacitance of capacitance variable diode D1, a series of a high-band coil and a low-band coil is provided on each of the hot and earth sides while switching diode D2 for switching the bands is provided so that the activation and deactivation of the diode correspond to variations of inductance of the circuit.

In this configuration, when the low band is selected, a positive voltage will be applied to low-band power supply terminal BL and high-band power supply BH will be opened. Therefore, a proportionally allotted voltage produced by band changing bias resistors R2 and R3 is applied to the cathode of switching diode D2, so that the diode D2 becomes non-conductive.

FIG. 2A shows an equivalent circuit to the tuning circuit when the low band is selected. In the equivalent circuit, the earth side is formed by a series of coil L1 and L2 while the hot side is formed by a series of coil L3 and coil L4. Since switching diode D2 is non-conductive, damping resistor R4 is connected between the earth side terminal of earth side coil L1 and the output terminal of hot side coil L3 while a combined resistance Ra of bias resistors R2 and R3 is connected to damping resistor R4 in parallel with coil L2. A capacitance VC on the output side of coil L4 is a combined capacitance of tuning capacitor C4 and capacitance variable diode D1.

In this case, the effect of high-band coils L2, L4 is markedly low as compared to that of low-band coils L1, L3, so that the high-band coils can be neglected when low band is selected. Accordingly, the equivalent circuit at the time of the low band being selected may be considered as a single tuning circuit which, as shown in FIG. 2B, is composed of hot side low-band coil L3, earth side low-band coil L1 and capacitance VC with damping resistor R4 connected on the output side of coil L3.

When the high band is selected, a positive voltage will be applied to high-band power supply terminal BH and low-band power supply BL will be opened. Therefore, the diode D2 becomes conductive.

FIG. 3 shows an equivalent circuit to the tuning circuit at the time of the high band being selected. In the equivalent circuit, earth side low-band coil L1 and hot side low-band coil L3 are connected in parallel with one another with the help of coupling capacitor C6 and switching diode D2, forming a combined inductance La while bias resistors R2, R3 are denoted by a combined resistance Ra. Accordingly, a single tuning circuit is composed by hot side high-band coil L4, earth side high-band coil L2 and capacitance VC.

By the way, in a case of a tuning circuit in which an FET (field effect transistor) is used in the next step or the high-frequency amplifying circuit and at the same time switching between the low and high bands is to be made for selecting channel signals, the pain in the low band in general tends to be greater than that in the high band depending upon the characteristics of FET used. To deal with this, low-band damping resistor R4 is provided as shown in FIG. 1 in order to eliminate the gain difference. That is, this damping resistor R4 is effective as shown in FIG. 2B only when the low band is selected so that the gain of the tuning circuit is damped at the time of the low band being selected.

However, the thus configured tuner contains many parts and therefore many connecting portions. Further, if all the parts are to be provided on a circuit board of a determined size, the packaging density becomes high, bringing about difficulty in soldering, and lowering the production yield. Therefore, the lowering of yield and the required costs for parts and labor due to the use of many parts heighten the production cost to a considerably high level.

To deal with this, the present applicant has previously proposed a tuner circuit as shown in FIG. 4. In this circuit, with no low-band damping resistor R4 provided, a coupling capacitor C6 is disposed between a junction of low-band coil L3 and high-band coil L4 on the hot side and a junction of bias resistors R2 and R3 while a switching diode D2 is provided between a junction point of low-band coil L1 and high-band coil L2 on the earth side and a junction of bias resistors R2 and R3. The remaining configuration of FIG. 4 is similar to that shown in FIG. 1. In other words, in the configuration shown in FIG. 1, switching diode D2 and coupling capacitor C 6 are exchanged with low-band damping resistor R4 being omitted.

In this arrangement, since, when the low band is selected, switching diode D2 becomes non-conductive, a single tuning circuit is composed by hot side low-band coil L3 and earth side low-band coil L1 and a capacitance VC as shown in an equivalent circuit in FIG. 5. In this case, a combined resistance Ra of bias resistors R2 and R3 functions as a damping resistance for the tuning circuit, so that damping resistor R4 is not required separately as used to be, the number of the parts and therefore the number of connecting portions can be reduced.

Nevertheless, the prior art tuner circuit described immediately above suffers a problem. That is, establishment of forward-directional current across switching diode D2 when the high band is selected, requires the resistance of bias resistor R2 to be lower than a certain level whereas establishment of a reverse-directional voltage applied across switching diode D2 when the low band is selected, requires a bias resistance ratio R2/R3 to be smaller than a certain value. These requirements limits the freedom of designing the circuit for determining the damping setup, and the like.

SUMMARY OF THE INVENTION

It is therefore an object of the present invention to provide a tuner circuit in which the parts can be reduced in number to improve the yield in soldering to thereby lower the cost while the freedom of circuit-designing is broadened.

In accordance with a first feature of the invention, a tuner circuit includes: an input tuning circuit; a switching diode in the input tuning circuit for switching receiving bands; a series of a low-band coil and a high-band coil disposed on the signal side; and a series of a low-band coil and a high-band coil disposed on the earth side, and is constructed such that the switching diode is disposed between a junction of the low-band coil and high-band coil on the signal side and another junction of the low-band coil and high-band coil on the earth side.

In this case, the tuner circuit of the present invention is constructed such that the junction of said low-band coil and high-band coil on the signal side is connected to a band switching terminal via a first bias resistor and an input side terminal of said low-band coil on the signal side is connected with a second bias resistor.

In accordance with a second feature of the present invention, a tuner circuit includes: an input tuning circuit; a switching diode in the input tuning circuit for switching receiving bands; a series of a low-band coil, a coupling capacitor and a high-band coil connected in that order on the earth side; and a series of a low-band coil and a high-band coil disposed on the signal side, and is constructed such that the switching diode is disposed between a junction of the earth side high-band coil and the coupling capacitor and another junction of the low-band coil and high-band coil on the signal side.

In this case, the tuner circuit of the present invention is constructed such that the junction of the low-band coil and high-band coil on the signal side is connected to a band switching terminal via a first bias resistor and a junction of the earth side low-band coil and the coupling capacitor is connected with a second bias resistor.

In the configuration of the present invention, when the low band is selected, the band switching terminal is applied with a reverse-directional voltage to deactivate the switching diode. As a result, the circuit is assumed as a single tuning circuit formed of the signal side low-band coil, the earth side low-band coil and the tuning capacitance. In addition, the bias resistor disposed between the junction of the low-band coil and high-band coil on the signal side and the band switching terminal serves to damp the tuning circuit. Basically, the damping is dominated by only the bias resistor.

On the other hand, since, at the time of the high band being selected, the switching diode becomes activated, the signal side and earth side low-band coils form a parallel circuit outside the tuning circuit, and a single turning circuit is composed by the signal side high-band coil, the earth side high-band coil and the tuning capacitance.

At this time, or when the high band is selected, as to the first configuration of the present invention, the forward-directional current flowing through the switching diode is dominated by only the second bias resistor that is connected to the input terminal of the signal side low-band coil while, as to the second configuration of the present invention, the forward-directional current flowing through the switching diode is dominated by only the second bias resistor disposed between the earth side low-band coil and the coupling capacitor.

Consequently, it is possible to improve the freedom in circuit-designing of setting up the reverse-directional voltage to be applied to the switching diode at the low-band being selected as well as the freedom of setting up the damping against the forward-directional current at the time of the high band being selected.

DESCRIPTION OF THE PREFERRED EMBODIMENTS

Figure 1:
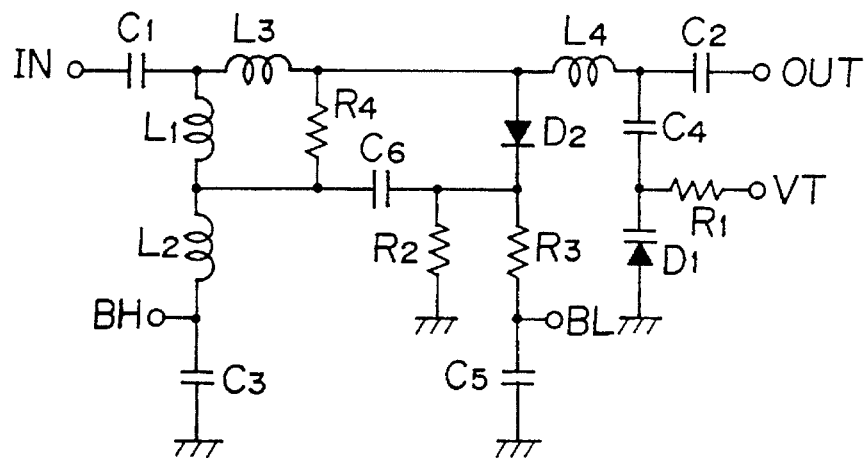
FIG. 1 is a circuit diagram showing an example of a prior art tuner circuit.
Figure 2A:
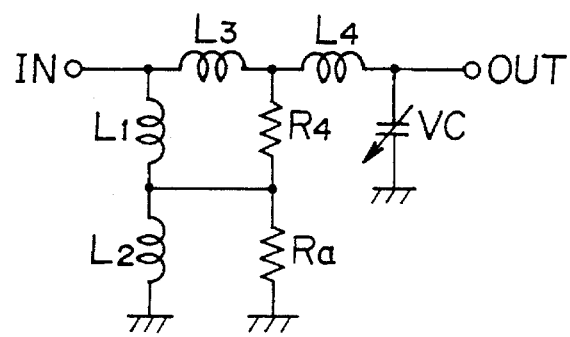
FIG. 2A is a circuit diagram showing an equivalent circuit to the circuit shown in FIG. 1 at the time of the low band being selected.
Figure 2B:
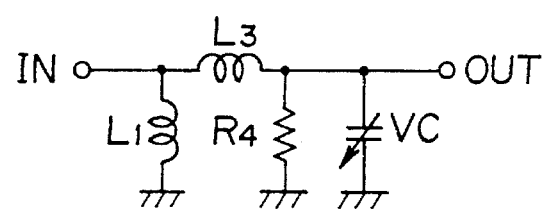
FIG. 2B is a circuit diagram of a single tuning circuit showing a simplified version of the equivalent circuit shown in FIG. 2A.
Figure 3:
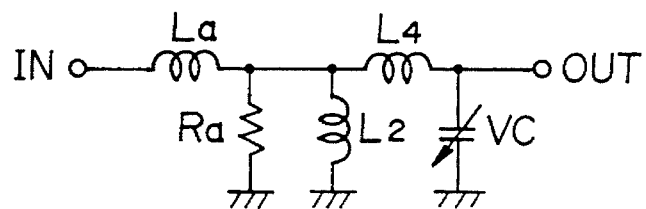
FIG. 3 is a circuit diagram showing an equivalent circuit to the circuit shown in FIG. 1 at the time of the high band being selected.
Figure 4:
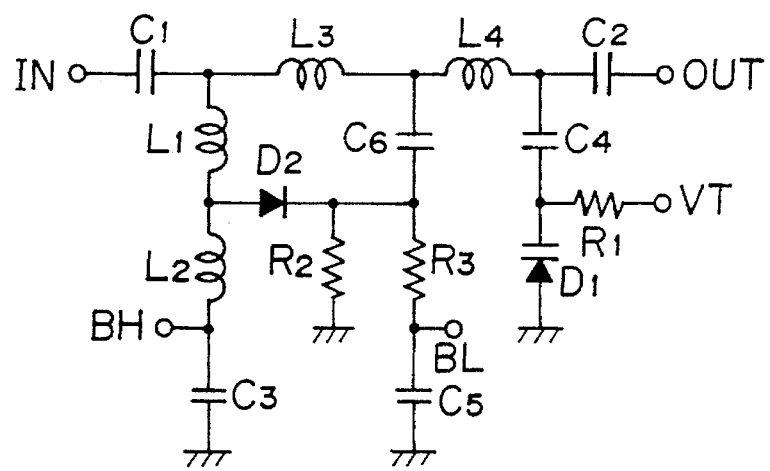
FIG. 4 is a circuit diagram showing a tuner circuit which has previously been proposed by the present inventor.
Figure 5:
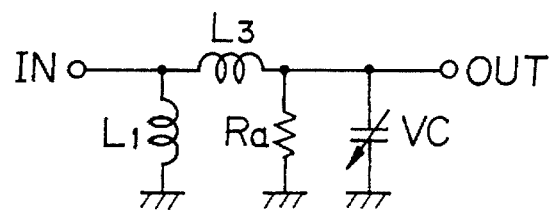
FIG. 5 is a circuit diagram showing a simplified version of an equivalent circuit to the circuit shown in FIG. 4 at the time of the low band being selected.
Figure 6:
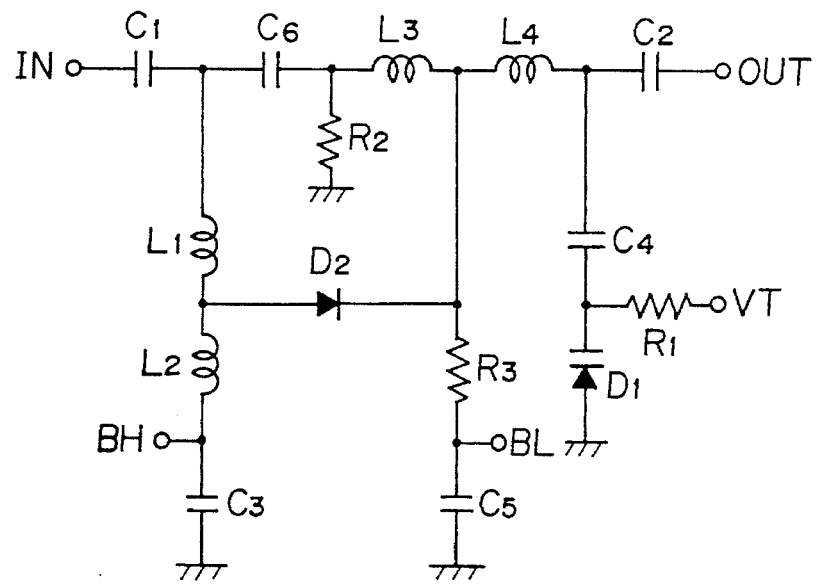
FIG. 6 is a circuit diagram showing a first embodiment of a tuner circuit of the present invention.

FIG. 6 is a circuit diagram showing a first embodiment of a tuner circuit of the present invention. Except in that a coupling capacitor C6 is serially disposed between a coupling capacitor C1 and a hot side (or signal side) low-band coil L3 while a bias resistor R2 is connected between the input terminal of hot side low-band coil L3 and earth, the embodiment is constructed identically with the configuration shown in FIG. 4.

Accordingly, a junction between hot side low-band coil L3 and a high-band coil L4 is connected with the cathode of a switching diode D2 and a bias resistor R3. The other end of bias resistor R3 is connected to a low-band power supply terminal BL and is grounded via a bypass capacitor C5. The anode of switching diode D2 is connected to a junction between a low-band coil L1 and high-band coil L2 both disposed on the earth side.

In this configuration, when the low band is selected, a positive voltage will be applied to low-band power supply terminal BL and high-band power supply BH will be opened. Accordingly, a proportionally allotted voltage produced by bias resistors R2 and R3 is applied to the cathode of switching diode D2, so that the diode D2 becomes non-conductive.

Figure 7A:
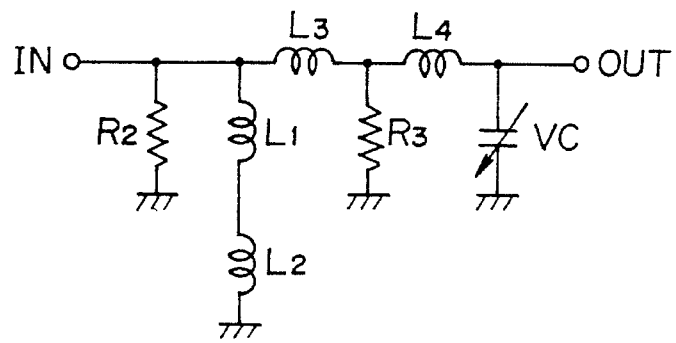
FIG. 7A is a circuit diagram showing an equivalent circuit to the Circuit shown in FIG. 6 at the time of the low band being selected.

FIG. 7A shows an equivalent circuit to the tuner circuit of the embodiment when the low band is selected. In the equivalent circuit, bias resistor R2 is connected in parallel on the input side of the circuit. The hot side is formed by a series of coils L3 and L4 while the earth side is formed by a series of coils L1 and L2. A capacitance VC, a combined capacitance of a tuning capacitor C4 and a capacitance variable diode D1 is connected to the output side of coil L4. Bias resistor R3 is connected between a junction of coil L3 and coil L4 and the earth.

Figure 7B:
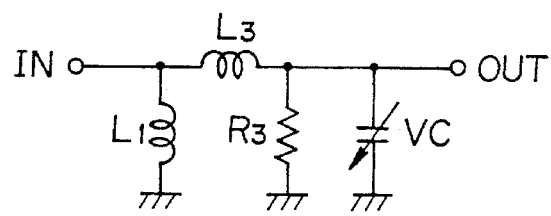
FIG. 7B is a circuit diagram of a single tuning circuit showing a simplified version of the equivalent circuit shown in FIG. 7A.

In this case, the effect of high-band coils L2, L4 is markedly low as compared to that of low-band coils L1, L3, so that the high-band coils can be neglected when low band is selected. In addition, because the input impedance of the circuit is low as compared to bias resistor R2, the equivalent circuit at the time of the low band being selected may be considered as a single tuning circuit which, as shown in FIG. 7B, is composed of hot side low-band coil L3, earth side low-band coil L1 and capacitance VC with the output side of coil L3 being damped by bias resistor R3.

In this way, since when the low band is selected, bias resistor R3 functions as the damping resistor for the tuning circuit, an additional damping resistor is not required and it is possible to reduce the number of the parts and therefore the number of connecting portions.

Figure 8:
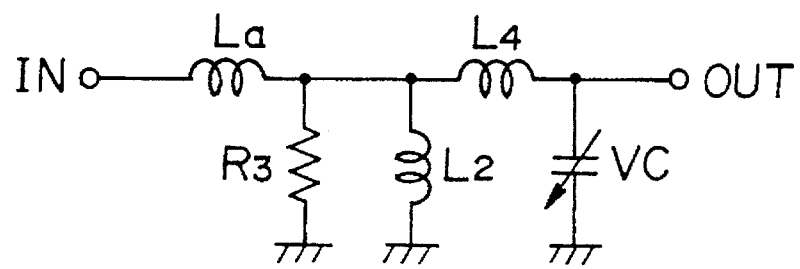
FIG. 8 is a circuit diagram showing an equivalent circuit to the circuit shown in FIG. 6 at the time of the high band being selected.

Next, at the time of the high band being selected, low-band power supply BL will be opened and a positive voltage will be applied to high-band power supply terminal BH. As a result, switching diode D2 is applied with a forward-directional voltage so that it becomes conductive. As a result, the equivalent circuit to the tuning circuit at the time of the high band being selected can be shown in FIG. 8. Specifically, hot side low-band coil L3 and earth side low-band coil L1 are connected in parallel with one another with the help of coupling capacitor C6 and switching diode D2, forming a combined inductance La that is without the tuning circuit but serially connected to the input side thereof while bias resistor R3 is connected in parallel. As to the tuning circuit component, a single tuning circuit is composed by hot side high-band coil L4, earth side high-band coil L2 and capacitance VC.

Figure 9:
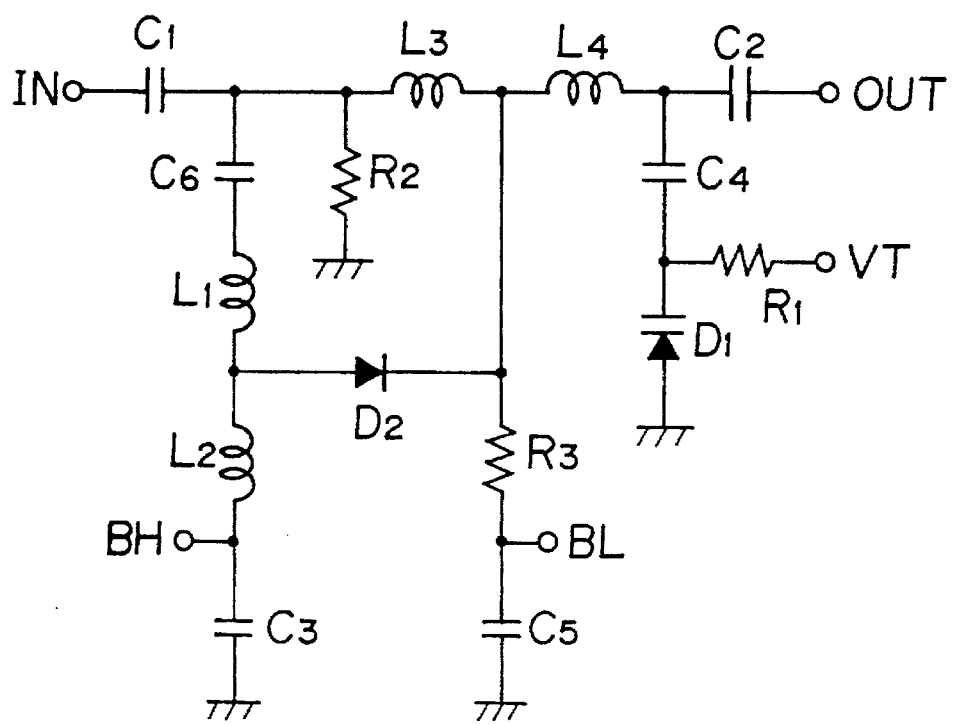
FIG. 9 is a circuit diagram showing a second embodiment of a tuner circuit of the present invention.

FIG. 9 is a circuit diagram showing a second embodiment of a tuner circuit of the present invention. The embodiment is constructed identically with the configuration of the above-described first embodiment shown in FIG. 6 except in that a coupling capacitor C6 is serially disposed between a coupling capacitor C1 and an earth side low-band coil L1. The operations when the low-band is selected and when the high-band is selected are the same with those in the aforementioned first embodiment.

Figure 10:
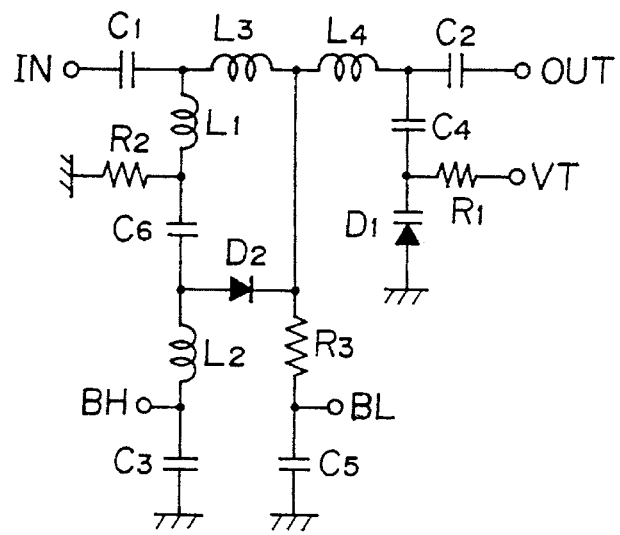
FIG. 10 is a circuit diagram showing a third embodiment of a tuner circuit of the present invention.

FIG. 10 is a circuit diagram showing a third embodiment of a tuner circuit of the present invention. The embodiment is constructed identically with the configuration of the above-described first embodiment shown in FIG. 6 except the following points. That is, in the first embodiment (FIG. 6), a low-band coil L3 and high-band coil L4 are serially connected on the hot side while, on the earth side, a coupling capacitor C6 is interposed serially between low-band coil L1 and high-band coil L2 and a junction between capacitor C6 and coil L2 is connected with the anode of switching diode D2. In addition, a bypass resistor R2 is connected to the earth side terminal of earth side low-band coil L1.

In this configuration, when the low band is selected, a positive voltage will be applied to low-band power supply terminal BL and high-band power supply BH will be opened. As a result, a proportionally allotted voltage produced by bias resistors R2 and R3 is applied to the cathode of switching diode D2, so that the diode D2 becomes non-conductive.

Figure 11:
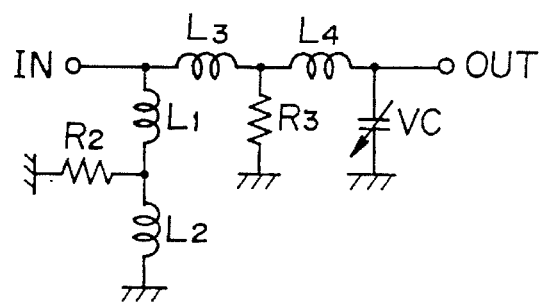
FIG. 11 is a circuit diagram showing an equivalent circuit to the circuit shown in FIG. 10 at the time of the low band being selected.

FIG. 11 shows an equivalent circuit to the tuner circuit of the embodiment when the low band is selected. In the equivalent circuit, the hot side is formed by a series of low-band coil L3 and high-band coil L4 while the earth side is formed by a series of low-band coil L1 and high-band L2. However, because when the low-band is selected, the effect of high-band coils L2, L4 is markedly low as compared to that of low-band coils L1, L3 and the input impedance of the circuit is low as compared to bias resistor R2, the equivalent circuit at the time of the low band being selected may be assumed as a single tuning circuit similar to that of the aforementioned embodiment shown in FIG. 7B, with the output side of coil L3 being damped by bias resistor R3.

Figure 12:
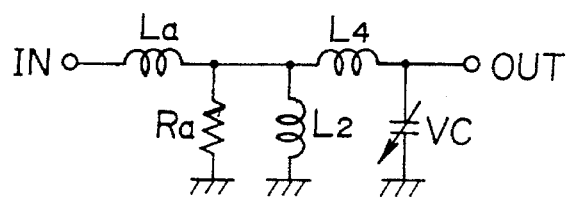
FIG. 12 is a circuit diagram showing an equivalent circuit to the circuit shown in FIG. 10 at the time of the high band being selected.

At the time of the high band being selected, low-band power supply BL will be opened and a positive voltage will be applied to high-band power supply terminal BH. Accordingly, switching diode D2 is applied with a forward-directional voltage so that it becomes conductive. As a result, the equivalent circuit to the tuning circuit at the time of the high band being selected can be shown in FIG. 12. Specifically, hot side low-band coil L3 and earth side low-band coil L1 are connected in parallel with one another with the help of coupling capacitor C6 and switching diode D2, forming a combined inductance La that is without the tuning circuit but serially connected to the input side thereof while a combined resistor Ra of bias resistors R2 and R3 is connected in parallel. As to the tuning circuit component, a single tuning circuit is composed by hot side high-band coil L4, earth side high-band coil L2 and capacitance VC.

As has been described in the embodiments, according to the present invention, since, at the time of the low band being selected, the bias resistance disposed between the junction of the low-band coil and high-band coil on the hot side and the band switching terminal, functions as a damping resistance for the tuning circuit, there is no need to provide an additional damping resistor as used to be, the number of the parts and therefore the number of connecting portions can be reduced. Accordingly, it is possible to reduce the packaging density on the board having a determined area, facilitating the soldering work so as to improve the yield. At the same time, the reduction in cost for parts and labors makes it possible to down the cost of the product.

In addition, since the damping for the tuning circuit at the time of the low band being selected is dominated by only the bias resistance disposed between the junction of the low-band coil and high-band coil on the hot side and the band switching terminal, the freedom for circuit-design can be markedly improved.

What is claimed is:

1. A tuner circuit comprising:
    an input tuning circuit including a signal side and an earth side connected at a node;
    a switching diode in said input tuning circuit for switching receiving bands;
    a first series connection of a first low-band coil and a first high-band coil disposed on the signal side of said input tuning circuit; and
    a second series connection of a second low-band coil and a second high-band coil disposed on the earth side of said input tuning circuit;
    said switching diode being directly connected to both a junction of said first low-band coil and said first high-band coil on the signal side, and a junction of said second low-band coil and said second high-band coil on the earth side.

2. A tuner circuit according to claim 1, wherein the junction of said first low-band coil and said first high-band coil on the signal side is connected to a band switching terminal via a first bias resistor, and said first low-band coil on the signal side is connected with a second bias resistor.

3. A tuner circuit according to claim 1, wherein the node receives an input signal, and the signal side produces an output signal.

4. A tuner circuit comprising:
    an input tuning circuit including a signal side and an earth side connected at a node;
    a switching diode in said input tuning circuit for switching receiving bands;
    a first series connection of a first low-band coil, a coupling capacitor and a first high-band coil connected in that order in a direction away from the node, on the earth side of said input tuning circuit; and
    a second series connection of a second low-band coil and a second high-band coil connected in that order in a direction away from the node on the signal side of said input tuning circuit;
    said switching diode being disposed between a junction of said first high-band coil and said coupling capacitor and a junction of said second low-band coil and said second high-band coil on the signal side.

5. A tuner circuit according to claim 4, wherein the junction of said second low-band coil and said second high-band coil on the signal side is connected to a band switching terminal via a first bias resistor, and a junction of said first low-band coil and said coupling capacitor is connected with a second bias resistor.

6. A tuner circuit according to claim 4, wherein said switching diode is directly connected to both the junction of said first high-band coil and said coupling capacitor, and the junction of said second low-band coil and said second high-band coil on the signal side.

7. A tuner circuit according to claim 4, wherein the node receives an input signal, and the signal side produces an output signal.

* * * * *